United States Patent
Choi

(10) Patent No.: US 8,952,243 B2
(45) Date of Patent: Feb. 10, 2015

(54) STACKED STRUCTURE INCLUDING VERTICALLY GROWN SEMICONDUCTOR, P-N JUNCTION DEVICE INCLUDING THE STACKED STRUCTURE, AND METHOD OF MANUFACTURING THEREOF

(75) Inventor: Jun-hee Choi, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 51 days.

(21) Appl. No.: 13/244,492

(22) Filed: Sep. 25, 2011

(65) Prior Publication Data

US 2012/0222732 A1 Sep. 6, 2012

(30) Foreign Application Priority Data

Mar. 3, 2011 (KR) .................. 10-2011-0019094

(51) Int. Cl.
| H01L 31/0352 | (2006.01) |
| H01L 33/16 | (2010.01) |
| H01L 33/00 | (2010.01) |
| H01L 33/24 | (2010.01) |
| H01L 31/0304 | (2006.01) |
| H01L 31/036 | (2006.01) |
| H01L 31/077 | (2012.01) |
| H01L 31/18 | (2006.01) |
| H01L 33/08 | (2010.01) |

(52) U.S. Cl.
CPC .............. *H01L 33/16* (2013.01); *H01L 33/007* (2013.01); *H01L 33/24* (2013.01); *H01L 31/03048* (2013.01); *H01L 31/03529* (2013.01); *H01L 31/036* (2013.01); *H01L 31/077* (2013.01); *H01L 31/1856* (2013.01); *H01L 33/08* (2013.01); *Y02E 10/544* (2013.01)

USPC ................ 136/255; 136/252; 257/52; 257/63

(58) Field of Classification Search
USPC ............................. 136/255, 252; 257/52, 63
See application file for complete search history.

(56) References Cited

U.S. PATENT DOCUMENTS

| 4,231,808 A * | 11/1980 | Tabei et al. .................. 136/260 |
| 4,881,979 A * | 11/1989 | Lewis ............................ 136/249 |
| 5,441,897 A * | 8/1995 | Noufi et al. ..................... 438/95 |
| 6,218,207 B1 | 4/2001 | Itoh et al. |
| 2003/0015234 A1* | 1/2003 | Yasuno ........................ 136/249 |
| 2003/0070707 A1* | 4/2003 | King et al. .................... 136/255 |
| 2004/0109666 A1* | 6/2004 | Kim, II ......................... 385/147 |
| 2005/0217722 A1* | 10/2005 | Komatsu et al. .............. 136/263 |
| 2010/0078055 A1* | 4/2010 | Vidu et al. .................... 136/244 |
| 2010/0224249 A1* | 9/2010 | Fukunaga et al. ............. 136/259 |
| 2011/0048514 A1* | 3/2011 | Norman et al. ................ 136/255 |

FOREIGN PATENT DOCUMENTS

| JP | 11-163404 A | 6/1999 |
| JP | 2002-343728 A | 11/2002 |
| KR | 10-2007-0116687 A | 12/2007 |
| KR | 10-2008-0041338 A | 5/2008 |
| KR | 10-2010-0048995 A | 5/2010 |

* cited by examiner

*Primary Examiner* — Golam Mowla
(74) *Attorney, Agent, or Firm* — Sughrue Mion, PLLC

(57) ABSTRACT

A stacked structure may include semiconductors or semiconductor layers grown on an amorphous substrate. A light-emitting device and a solar cell may include the stacked structure including the semiconductors grown on the amorphous substrate. A method of manufacturing the stacked structure, and the light-emitting device and the solar cell including the stacked structure may involve growing a crystalline semiconductor layer on an amorphous substrate.

13 Claims, 8 Drawing Sheets

STACKED STRUCTURE INCLUDING VERTICALLY GROWN SEMICONDUCTOR, P-N JUNCTION DEVICE INCLUDING THE STACKED STRUCTURE, AND METHOD OF MANUFACTURING THEREOF

CROSS-REFERENCE TO RELATED APPLICATION

This application claims the benefit of Korean Patent Application No. 10-2011-0019094, filed on Mar. 3, 2011, in the Korean Intellectual Property Office, the disclosure of which is incorporated herein in its entirety by reference.

BACKGROUND

1. Field

Apparatuses and methods consistent with embodiments relate to a stacked structure including vertically grown semiconductors, a p-n junction device including the stacked structure, and a method of manufacturing the stacked structure and the p-n junction device.

2. Description of the Related Art

Recently, a light-emitting device such as a blue light-emitting diode or a white light-emitting diode including a nitride semiconductor has been commercialized. In order to manufacture a semiconductor device including the nitride semiconductor, it is necessary to grow a high-quality nitride single crystal. However, it can be difficult to find a substrate to grow a nitride single crystal, which has similar values as a lattice constant and a thermal expansion coefficient of the nitride single crystal. In general, the nitride single crystal is grown on a heterogeneous substrate, including a sapphire substrate or a silicon carbide (SiC) substrate, by using a vapor growth method including a metal organic chemical vapor deposition (MOCVD) method, a hydride vapor phase epitaxy (HVPE) method, or the like, or by using a molecular beam epitaxy (MBE) method. However, a single crystal sapphire substrate or a SiC substrate is expensive and is significantly limited in size, so that they are not appropriate for an enlargement and cost-reduction of the semiconductor device including the nitride semiconductor.

SUMMARY

According to an aspect of an embodiment, there is provided a stacked structure which includes an amorphous substrate; a metal layer formed on the amorphous substrate; a buffer layer formed on the metal layer; a mask layer formed on the buffer layer and having a plurality of holes exposing the buffer layer; and a plurality of semiconductor elements grown from the areas of the buffer layer exposed by the plurality of holes of the mask layer so as to extend through the plurality of holes of the mask layer.

Each of the plurality of the semiconductor elements has a rod shape or a pyramid shape.

Each of the plurality of the semiconductor elements includes a III-V group-based compound semiconductor.

Each of the plurality of semiconductor elements includes at least one selected from the group consisting of GaN, GaInN, AlGaN, and AlGaInN.

A crystalline structure of the metal layer may be a hexagonal close-packed (HCP) structure or a face-centered cubic (FCC) structure.

A lattice mismatch of the metal layer with respect to each of the plurality of semiconductor elements is equal to or less than about 20%.

The metal layer may have a preferred orientation in a vertical direction (a C-axis direction) with respect to a surface of the metal layer.

The metal layer may be formed of at least one metal selected from the group consisting of Ti, Hf, Zr, and Al.

The metal layer may include a nitride-based metal layer.

The amorphous substrate may be formed of glass or plastic.

The buffer layer may include at least one layer selected from among the group consisting of a layer formed of a III-V group-based compound semiconductor and a layer formed of TiN.

The III-V group-based compound semiconductor may include at least one selected from the group consisting of GaN, AN, AlGaN, InGaN, and InAlGaN.

According to an aspect of another embodiment, there is provided a method of manufacturing a stacked structure which includes the operations of forming a metal layer on an amorphous substrate; forming a buffer layer on the metal layer; forming a mask layer on the buffer layer, and forming a plurality of holes in the mask layer by patterning the mask layer; and growing a plurality of semiconductor elements from the areas of the buffer layer exposed by the plurality of holes of the mask layer so as to extend through the plurality of holes of the mask layer.

Each of the plurality of semiconductor elements has a rod shape or a pyramid shape.

Each of the plurality of the semiconductor elements is formed of at least one selected from the group consisting of GaN, GaInN, AlGaN, and AlGaInN.

The metal layer may be formed of metal with a crystalline structure that is a hexagonal close-packed (HCP) structure or a face-centered cubic (FCC) structure.

The metal layer may be formed of metal having a lattice mismatch with each of the plurality of semiconductor elements that is equal to or less than about 20%.

The metal layer may be formed of at least one metal selected from the group consisting of Ti, Hf, Zr, and Al.

The method may further include the operation of thermally treating at least one of the metal layer and the buffer layer in a gas atmosphere including nitrogen so as to allow at least one of the metal layer and the buffer layer to have a preferred orientation in a vertical direction (a C-axis direction) with respect to a surface of the at least one of the metal layer and the buffer layer.

The amorphous substrate may be formed of glass or plastic.

According to an aspect of another embodiment, a light-emitting device includes an amorphous substrate; a metal layer formed on the amorphous substrate; a buffer layer formed on the metal layer; a mask layer formed on the buffer layer and having a plurality of holes exposing the buffer layer; a plurality of first conductive type semiconductor elements grown from the areas of the buffer layer exposed by the plurality of holes of the mask layer so as to extend through the plurality of holes of the mask layer; an active layer disposed on the plurality of first conductive type semiconductor elements; a second conductive type semiconductor layer disposed on the active layer; and a transparent electrode layer formed on the second conductive type semiconductor layer.

A crystalline structure of the metal layer may be a hexagonal close-packed (HCP) structure or a face-centered cubic (FCC) structure.

A lattice mismatch of the metal layer with respect to each of the plurality of first conductive type semiconductor elements is equal to or less than about 20%.

According to an aspect of another embodiment, there is provided a solar cell which includes an amorphous substrate; a metal layer formed on the amorphous substrate; a buffer layer formed on the metal layer; a mask layer formed on the buffer layer and having a plurality of holes exposing areas of the buffer layer; a plurality of first conductive type semiconductor elements grown from the areas of the buffer layer exposed by the plurality of holes of the mask layer so as to extend through the plurality of holes of the mask layer; a second conductive type semiconductor layer disposed on the plurality of first conductive type semiconductor elements; and a transparent electrode layer formed on the second conductive type semiconductor.

The solar cell may further include an intrinsic (I)-type semiconductor layer interposed between the plurality of first conductive type semiconductor elements and the second conductive type semiconductor layer.

Each of the plurality of first conductive type semiconductor elements has a rod shape or a pyramid shape.

A crystalline structure of the metal layer may be a hexagonal close-packed (HCP) structure or a face-centered cubic (FCC) structure.

A lattice mismatch of the metal layer with respect to each of the plurality of first conductive type semiconductor elements is equal to or less than about 20%.

BRIEF DESCRIPTION OF THE DRAWINGS

These and/or other aspects will become apparent and more readily appreciated from the following description of embodiments, taken in conjunction with the accompanying drawings of which.

DETAILED DESCRIPTION

Figure 1:
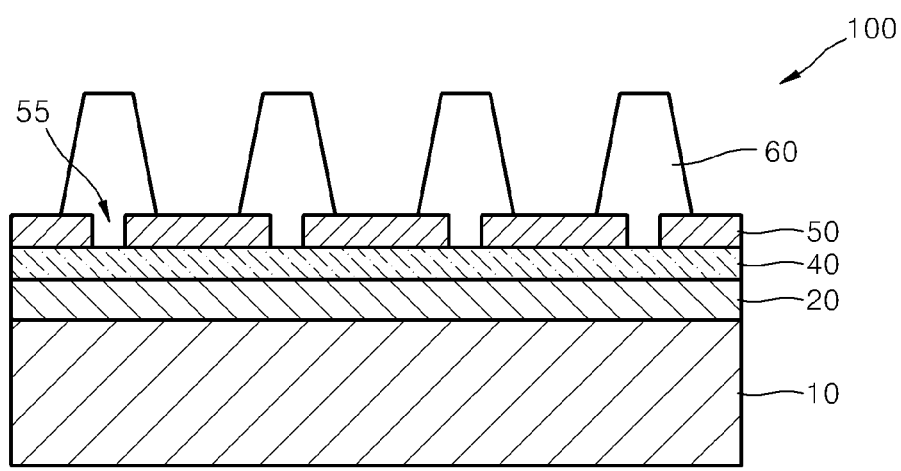
FIG. 1 is a cross-sectional view of a stacked structure including a plurality of semiconductor elements grown from areas of the buffer layer, according to an embodiment.

Various embodiments will now be described more fully with reference to the accompanying drawings in which some embodiments are shown.

Detailed illustrative embodiments are disclosed herein. However, specific structural and functional details disclosed herein are merely representative for purposes of describing exemplary embodiments. The aspects of the embodiments may be embodied in many alternate forms and should not be construed as limited to only the embodiments set forth herein.

Accordingly, while embodiments are capable of various modifications and alternative forms, the embodiments are shown by way of example in the drawings and will herein be described in detail. It should be understood, however, that there is no intent to limit the embodiments to the particular forms disclosed, but on the contrary, the embodiments are to cover all modifications, equivalents, and alternatives falling within the scope of the inventive concept. Like numbers refer to like elements throughout the description of the figures.

It will be understood that, although the terms 'first', 'second', etc. may be used herein to describe various elements, these elements should not be limited by these terms. These terms are only used to distinguish one element from another. For example, a first element could be termed a second element, and, similarly, a second element could be termed a first element, without departing from the scope of embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof In the drawings, the thicknesses of layers and regions are exaggerated for clarity. Like reference numerals in the drawings denote like elements.

Hereinafter, a stacked structure including a plurality of grown semiconductor elements, a p-n junction device including the stacked structure, and a method of manufacturing them according to one or more embodiments will be described in detail with reference to the accompanying drawings. In the drawings, like reference numerals in the drawings denote like elements, and the size of each component may be exaggerated for clarity.

Figure 2A:
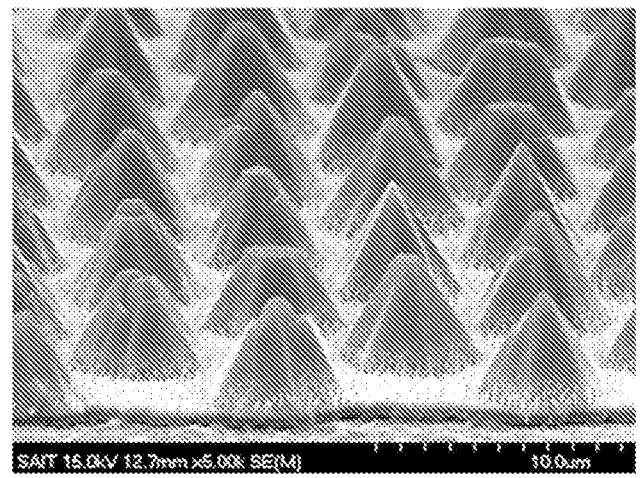
FIG. 2A is a stereoscopic image of the stacked structure including the grown plurality of semiconductor elements.
Figure 2B:
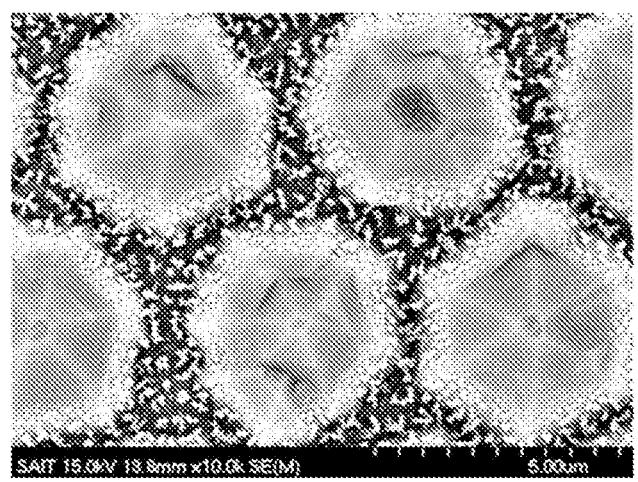
FIG. 2B is a plane image of the stacked structure.

FIG. 1 is a cross-sectional view of a stacked structure 100 including the grown plurality of semiconductor elements 60, according to an embodiment. FIGS. 2A and 2B are respectively a stereoscopic image and a plane image of the stacked structure 100.

Referring to FIG. 1, the stacked structure 100 may include an amorphous substrate 10, a metal layer 20 formed on the amorphous substrate 10, a buffer layer 40 formed on the metal layer 20, and a mask layer 50 formed on the buffer layer 40. A plurality of holes 55 may be formed in the mask layer 50 so as to expose areas of the buffer layer 40. The stacked structure 100 may include the semiconductor or plurality of semiconductor elements 60 that are grown from the areas of the buffer layer 40 via each of the holes 55.

For example, the amorphous substrate 10 may include glass, plastic or the like, is inexpensive, compared to a sapphire substrate or a silicon substrate, and may be enlarged. However, a nitride semiconductor such as GaN may not be epitaxially grown directly on the amorphous substrate 10 but may be grown in a random direction, that is, the nitride semiconductor is grown without directionality.

The metal layer 20 may be formed on the amorphous substrate 10 and may be formed of metal with a crystalline structure that is a hexagonal close-packed (HCP) structure or a face-centered cubic (FCC) structure. A crystal face of the metal layer 20 may be an HCP (0001) face or an FCC (111) face. That is, the metal layer 20 may have a preferred orientation in a vertical direction (a C-axis direction) with respect to a surface of the metal layer 20. The metal layer 20 may have the preferred orientation in the C-axis direction by being thermally treated at a temperature between about 100° C. and about 1500° C. Also, the metal layer 20 may be formed of metal having a small lattice mismatch with the grown plurality of semiconductor elements 60, e.g., the metal layer 20 may be formed of metal having a lattice mismatch with the grown plurality of semiconductor elements 60 that is equal to or less than about 20%. The metal layer 20 may be formed of metal satisfying the aforementioned two conditions, and examples of the metal may be Ti, Hf, Zr, and Al.

The buffer layer 40 may be disposed on the metal layer 20, and may be formed of a III-V group-based compound semiconductor, TiN, or the like. The buffer layer 40 may include at least one layer selected from among the group consisting of a layer formed of the III-V group-based compound semiconductor and a layer formed of TiN. That is, the buffer layer 40 may be a single layer formed by using one of the aforementioned materials or may be a plurality of layers such as two layers, three layers, or the like. Here, the III-V group-based compound semiconductor may include at least one selected from the group consisting of GaN, AN, AlGaN, InGaN, and InAlGaN. Also, due to the preferred orientation of the metal layer 20 below the buffer layer 40, the buffer layer 40 may have a preferred orientation in a vertical direction (the C-axis direction) with respect to a surface of the buffer layer 40. The buffer layer 40 may have the preferred orientation in the C-axis direction by being thermally treated at a temperature between about 100° C. and about 1500° C., e.g., at about 1050° C. in a gas atmosphere including nitrogen.

The mask layer 50 may be formed on the buffer layer 40 and may include the holes 55 exposing the buffer layer 40 formed therebelow. For example, the mask layer 50 may be formed of $SiO_x$ (x is a natural number), $Si_xN_y$ (x and y are natural numbers), or the like. A diameter of each hole 55 formed in the mask layer 50 may be between about 10 nm and about 5 μm. The grown plurality of semiconductor elements 60 are grown from the buffer layer 40 respectively via the holes 55, so that a position for growth of the plurality of semiconductor elements 60, a size of the plurality of semiconductor elements 60, and the like may be determined according to a position and a size of the holes 55.

The plurality of semiconductor elements 60 may be vertically grown from the buffer layer 40 via the holes 55. That is, the buffer layer 40 may be a seed layer of the grown plurality of semiconductor elements 60. The grown plurality of semiconductor elements 60 may have a rod shape or a pyramid shape, and due to the preferred orientation of the buffer layer 40, the grown plurality of semiconductor elements 60 may have a preferred orientation in a vertical direction (the C-axis direction) with respect to a surface of the buffer layer 40, that is, a surface on which the growth of the plurality of semiconductor elements 60 starts. Since the grown plurality of semiconductor elements 60 are grown via the holes 55, it is possible to control the position, arrangement, and size of the grown plurality of semiconductor elements 60 by selecting the position, arrangement, and size of the holes 55. Thus, the stacked structure 100 may provide the grown plurality of semiconductor elements 60 having a selected direction and position and then grown on the amorphous substrate 10. That is, the stacked structure 100 may provide the grown plurality of semiconductor elements 60 that are preferably oriented in the C-axis direction on the amorphous substrate 10 capable of being enlarged and manufactured at a reduced cost. The grown plurality of semiconductor elements 60 may be applied to various semiconductor devices.

The grown plurality of semiconductor elements 60 may include a III-V group-based compound semiconductor, and may include at least one selected from the group consisting of GaN, GaInN, AlGaN, and AlGaInN. For example, the buffer layer 40 may include a low-temperature (LT)-GaN grown on the metal layer 20 at a low temperature between about 450° C. and about 800° C. And, the grown plurality of semiconductor elements 60 may include a high temperature (HT)-GaN that is vertically grown from the buffer layer 40 at a high temperature between about 980° C. and about 1100° C. The LT-GaN may have a preferred orientation in the C-axis direction due to the metal layer 20 formed therebelow, and the HT-GaN may have a preferred orientation in the C-axis direction due to the preferred orientation of the LT-GaN.

Referring to FIGS. 2A and 2B, it can be seen that the stacked structure 100 includes pyramid or rod-shaped semiconductors that are preferably oriented in a C-axis direction (0001), unlike semiconductor devices grown in a random direction on an amorphous substrate. That is, it can be seen that a top surface of each pyramid or rod-shaped semiconductor is a (0001) face, and side surfaces of each pyramid or rod-shaped semiconductor are (10-11) faces slanting toward the top surface at about 61 degrees. Thus, it can be seen that each pyramid or rod-shaped semiconductor included in the stacked structure 100 may be grown having a shape similar to that of a semiconductor grown on a single crystal substrate.

Figure 3:
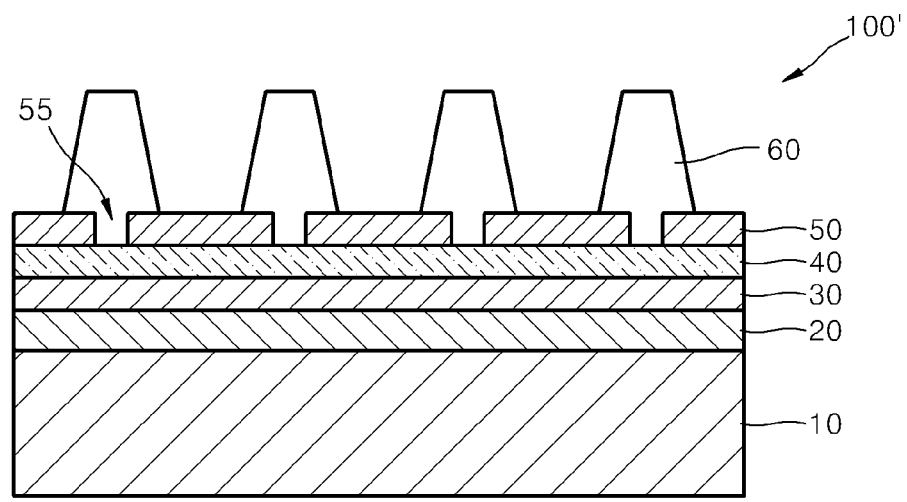
FIG. 3 is a cross-sectional view of a stacked structure including a plurality of semiconductor elements grown from areas of a buffer layer, according to another embodiment.

FIG. 3 is a cross-sectional view of a stacked structure 100' including the plurality of grown semiconductor elements 60, according to another embodiment. The stacked structure 100' will be described in detail in terms of its differences to the stacked structure 100 of FIG. 1.

Referring to FIG. 3, the stacked structure 100' may include the amorphous substrate 10, the metal layer 20 formed on the amorphous substrate 10, a nitride-based metal layer 30 formed on the metal layer 20, the buffer layer 40 formed on the nitride-based metal layer 30, and the mask layer 50 formed on the buffer layer 40. The holes 55 may be formed in the mask layer 50 so as to expose the buffer layer 40. The stacked structure 100' may include the grown plurality of semiconductor elements 60 that are vertically grown from the buffer layer 40 respectively via the holes 55.

The nitride-based metal layer 30 may be formed on the metal layer 20 and a crystalline structure of the nitride-based metal layer 30 may be a HCP structure or a FCC structure. A crystal face of the nitride-based metal layer 30 may be an HCP (0001) face or an FCC (111) face. That is, the nitride-based metal layer 30 may have a preferred orientation in a vertical direction (a C-axis direction) with respect to its surface. Here, the nitride-based metal layer 30 may have the preferred orientation in the C-axis direction by being thermally treated at a temperature between about 100° C. and about 1500° C. in a gas atmosphere including nitrogen such as $NH_3$. The nitride-based metal layer 30 may include metal having a small lattice mismatch with the grown plurality of semiconductor elements 60, e.g., the nitride-based metal layer 30 may include metal having a lattice mismatch with the grown plurality of semiconductor elements 60 that is equal to or less than about 20%. The nitride-based metal layer 30 may include nitride-based metal having the aforementioned two conditions, i.e., the nitride-based metal layer 30 may include nitride-based metal having the preferred orientation in the vertical direction (the C-axis direction) with respect to the surface of the nitride-based metal layer 30, and having the small lattice mismatch with the grown plurality of semiconductor elements 60. For example, the nitride-based metal layer 30 may include TiN, HfN, ZrN, AN, or the like.

Next, a p-n junction device including one of the stacked structures 100 and 100' will be described. Examples of the p-n junction device are a light-emitting device and a solar cell but the examples are not limited thereto, and the stacked structures 100 and 100' may be applied to various semiconductor devices.

Figure 4:
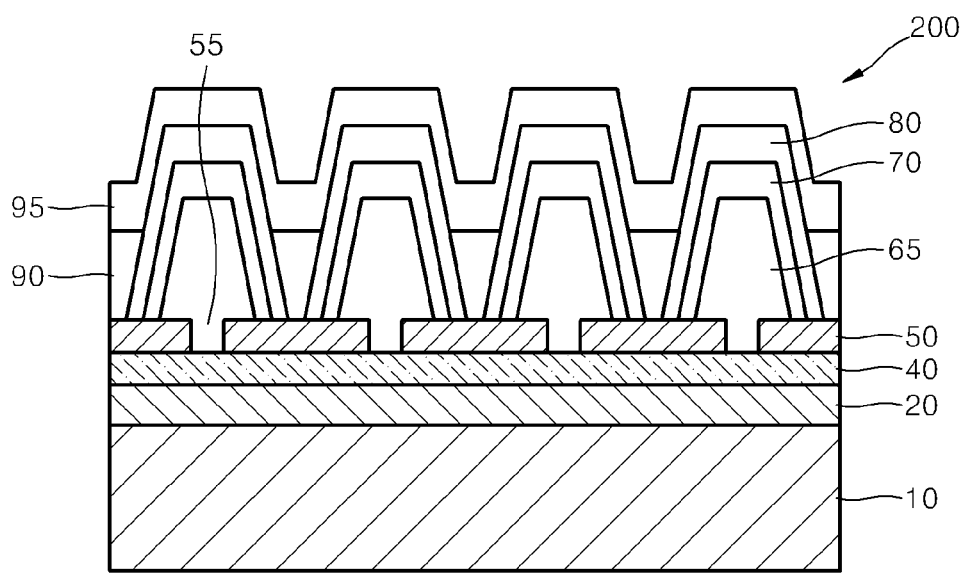
FIG. 4 is a cross-sectional view of a light-emitting device including a stacked structure including the grown plurality of semiconductor elements, according to an embodiment.

FIG. 4 is a cross-sectional view of a light-emitting device 200 including the stacked structure 100 of FIG. 1 including vertically grown semiconductors, according to an embodiment. Since the light-emitting device 200 includes the stacked structure 100 of FIG. 1 that is already described above, the light-emitting device 200 will be described in terms of its additional configuring elements.

Referring to FIG. 4, the light-emitting device 200 may include the amorphous substrate 10, the metal layer 20 formed on the amorphous substrate 10, the buffer layer 40 formed on the metal layer 20, and the mask layer 50 formed on the buffer layer 40. The holes 55 may be formed in the mask layer 50 so as to expose the buffer layer 40. The light-emitting device 200 may further include a first conductive type semiconductor elements 65 grown from areas of the buffer layer 40 exposed by each of the holes 55. The light-emitting device 200 may further include an active layer 70, a second conductive type semiconductor layer 80, and a transparent electrode layer 95 sequentially formed on the first conductive type semiconductor elements 65. The light-emitting device 200 may further include an insulating layer 90 disposed between the mask layer 50 and the transparent electrode layer 95.

The metal layer 20 may be formed of metal with a crystalline structure that is an HCP structure or an FCC structure, and may have a preferred orientation in a vertical direction (a C-axis direction) with respect to its surface. The metal layer 20 may be formed of metal having a lattice mismatch with the vertically grown first conductive type semiconductor elements 65 that is equal to or less than about 20%. For example, the metal layer 20 may include at least one metal selected from the group consisting of Ti, Hf, Zr, and Al. Also, the metal layer 20 may be used as a first electrode, e.g., an n-type electrode of the light-emitting device 200.

The first conductive type semiconductor elements 65 may be grown from the buffer layer 40 exposed by each of the holes 55 formed in the mask layer 50, and may include a III-V group-based compound semiconductor doped with a first conductive type dopant. The III-V group-based compound semiconductor may include at least one selected from the group consisting of GaN, GaInN, AlGaN, and AlGaInN. For example, the first conductive type semiconductor elements 65 may be formed by doping a semiconductor material having a composition formula of $Al_xIn_yGa_{(1-x-y)}N$ (where, $0 \leq x \leq 1$, $0 \leq y \leq 1$, $0 \leq x+y \leq 1$) with a first conductive type dopant. The first conductive type dopant may be an n-type dopant, and the n-type dopant may include P, As, Sb, Si, Sn, Ge, Se, or Te.

The active layer 70 may be formed on the first conductive type semiconductor elements 65 so as to cover the first conductive type semiconductor elements 65. The active layer 70 may emit light having a predetermined energy due to the recombination of electrons and holes, and may be formed of a semiconductor material including $In_xGa_{1-x}N (0 \leq x \leq 1)$ so that a bandgap energy may be adjusted according to an Indium content. Also, the active layer 70 may include a multi-quantum well (MQW) layer formed by alternately stacking a quantum barrier layer and a quantum well layer.

The second conductive type semiconductor layer 80 may be formed on the active layer 70 so as to cover the active layer 70. The second conductive type semiconductor layer 80 may include a III-V group-based compound semiconductor doped with a second conductive type dopant, and may include at least one selected from the group consisting of GaN, GaInN, AlGaN, and AlGaInN. For example, the second conductive type semiconductor layer 80 may be formed by doping a semiconductor material having a composition formula of $Al_xIn_yGa_{(1-x-y)}N$ (where, $0 \leq x \leq 1$, $0 \leq y \leq 1$, $0 \leq x+y \leq 1$) with a second conductive type dopant. The second conductive type dopant may be a p-type dopant, and the p-type dopant may include B, Al, Mg, Zn, Be, or C. In the light-emitting device 200, the first conductive type semiconductor elements 65 may be an n-type semiconductor and the second conductive type semiconductor layer 80 may be a p-type semiconductor, or vice versa.

The transparent electrode layer 95 may be formed on a portion of the second conductive type semiconductor layer 80, and may cover a top portion of the second conductive type semiconductor layer 80. The transparent electrode layer 95 may be formed of a transparent conductive material including Indium tin oxide (ITO), zinc oxide (ZnO), tin oxide (SnO2), or the like. The insulating layer 90 may be disposed between the mask layer 50 and the transparent electrode layer 95, and may be formed of an insulating material such as $SiO_2$ or a polymer material such as polyamide.

The light-emitting device 200 may include pyramid shaped or rod-shaped semiconductors preferably oriented in a C-axis direction (0001) on the amorphous substrate 10. Thus, in the light-emitting device 200, a light emission area is increased compared to a thin film light-emitting device so that a light emission efficiency per unit area may be improved. Since the light-emitting device 200 emits uniform light, the light-emitting device 200 may be used as a surface light source, and may provide a large size light-emitting device formed on an inexpensive amorphous substrate.

Figure 5:
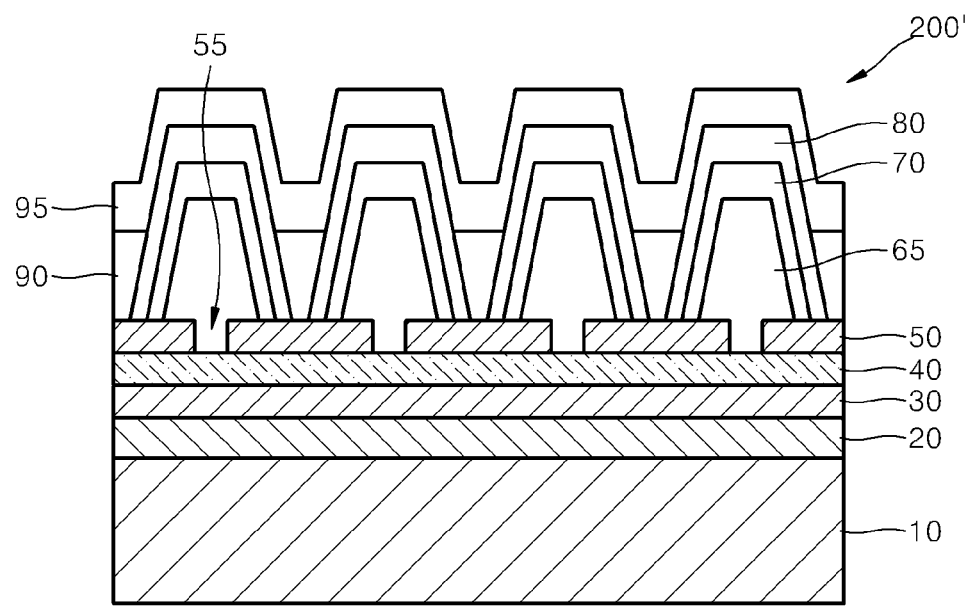
FIG. 5 is a cross-sectional view of a light-emitting device including a stacked structure including the grown plurality of semiconductor elements, according to another exemplary embodiment.

FIG. 5 is a cross-sectional view of a light-emitting device 200' according to another embodiment. The light-emitting device 200' of FIG. 5 will be described in detail in terms of its difference to the light-emitting device 200 of FIG. 4.

Referring to FIG. 5, the light-emitting device 200' may further include a nitride-based metal layer 30 disposed between the metal layer 20 and the buffer layer 40. The nitride-based metal layer 30 may be formed on the metal layer 20, and may have a preferred orientation in a vertical direction (a C-axis direction) with respect to a surface of the nitride-based metal layer 30.

The nitride-based metal layer 30 may have the preferred orientation in the C-axis direction by being thermally treated at a temperature between about 100° C. and about 1500° C. in a gas atmosphere including nitrogen such as $NH_3$. The nitride-based metal layer 30 may include metal having a lattice mismatch with first conductive type semiconductor elements 65 that is equal to or less than about 20%. The nitride-based metal layer 30 may include nitride-based metal having the aforementioned two conditions, e.g., the nitride-based metal layer 30 may include TiN, HfN, ZrN, AN, or the like.

Figure 6:
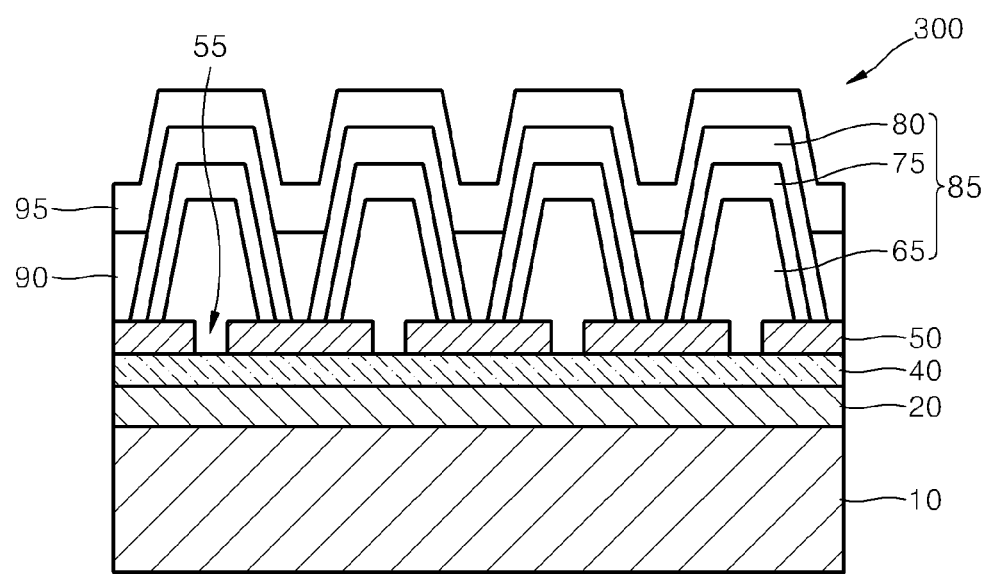
FIG. 6 is a cross-sectional view of a solar cell including a stacked structure including the grown plurality of semiconductor elements, according to an exemplary embodiment.

FIG. 6 is a cross-sectional view of a solar cell 300 including the stacked structure 100 of FIG. 1 including vertically grown semiconductors, according to an exemplary embodiment. Since the solar cell 300 includes the stacked structure 100 of FIG. 1 that is already described above, the solar cell 300 will be described in terms of its additional configuring elements.

Referring to FIG. 6, the solar cell 300 may include the amorphous substrate 10, the metal layer 20 formed on the amorphous substrate 10, the buffer layer 40 formed on the metal layer 20, and the mask layer 50 formed on the buffer layer 40. The holes 55 may be formed in the mask layer 50 so as to expose the buffer layer 40. The solar cell 300 may include a first conductive type semiconductor elements 65 vertically grown from the buffer layer 40 via each of the holes 55. The solar cell 300 may further include a second conductive type semiconductor layer 80, and a transparent electrode layer 95 sequentially formed on the first conductive type semiconductor elements 65. The solar cell 300 may further include an intrinsic semiconductor layer, i.e., an I-type semiconductor layer 75 disposed between the first conductive type semiconductor elements 65 and the second conductive type semiconductor layer 80. Also, the solar cell 300 may include an insulating layer 90 disposed between the mask layer 50 and the transparent electrode layer 95.

The solar cell 300 may include a light-absorbing layer 85 including the first conductive type semiconductor elements 65 and the second conductive type semiconductor layer 80. The light-absorbing layer 85 may further include the I-type semiconductor layer 75 disposed between the first conductive type semiconductor elements 65 and the second conductive type semiconductor layer 80. The light-absorbing layer 85 may convert a solar light energy into an electric energy, and may generate an electron-hole pair (EHP) by absorbing the solar light energy. The generated electron and hole may move to the first conductive type semiconductor elements 65 and the second conductive type semiconductor layer 80, respectively, an n-type electrode and a p-type electrode may collect the electron and hole, and the electron and hole may be used as an electric energy in an external source. Here, the first conductive type semiconductor elements 65 may be an n-type semiconductor, the second conductive type semiconductor layer 80 may be a p-type semiconductor, the metal layer 20 may be the n-type electrode, and the transparent electrode layer 95 may be the p-type electrode. As illustrated in FIG. 7I, a solar cell 300' may further include a nitride-based metal layer 30 disposed between the metal layer 20 and the buffer layer 40, and the description about the nitride-based metal layer 30 is the same as the one above.

The solar cell 300 may include pyramid or rod-shaped semiconductors preferably oriented in a C-axis direction (0001) on the amorphous substrate 10, so that, in the solar cell 300, a light-receiving area per unit area, and an electron-hole generation area may be increased compared to a thin film solar cell. Accordingly, in the solar cell 300, an energy conversion rate for converting a solar light energy into an electric energy may be improved. Also, the solar cell 300 may be formed on the inexpensive amorphous substrate 10 and may provide a large size solar cell.

Next, a method of manufacturing the stacked structure, and the light-emitting device and the solar cell that are p-n junction devices including the stacked structure will be described.

FIGS. 7A through 7I are diagrams for describing a method of manufacturing the stacked structures 100 and 100', and the light-emitting devices 200 and 200' and the solar cells 300 and 300' which include the stacked structures 100 and 100', according to an embodiment.

Figure 7A:
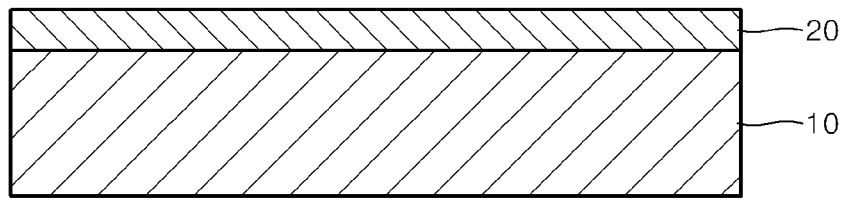
FIGS. 7A through 7I are diagrams for describing a method of manufacturing a stacked structure, a light-emitting device, and a solar cell, according to an exemplary embodiment.

Referring to FIG. 7A, the metal layer 20 is formed on the amorphous substrate 10. The amorphous substrate 10 may be formed of glass, plastic, or the like, may be less expensive than a silicon substrate or a sapphire substrate, and may be enlarged. The metal layer 20 may be formed by using an e-beam evaporation method or a sputtering method. The metal layer 20 may be formed of metal with a crystalline structure that is a HCP structure or a FCC structure, and a crystal face of the metal layer 20 may be an HCP (0001) face or an FCC (111) face. That is, the metal layer 20 may have a preferred orientation in a vertical direction (a C-axis direction) with respect to its surface.

The metal layer 20 may have the preferred orientation in the C-axis direction by being thermally treated at a temperature between about 100° C. and about 1500° C. Also, the metal layer 20 may be formed of metal having a small lattice mismatch with the grown plurality of semiconductor elements 60, e.g., the metal layer 20 may be formed of metal having a lattice mismatch with the grown plurality of semiconductor elements 60 that is equal to or less than about 20%. The metal layer 20 may be formed of metal satisfying the aforementioned two conditions, and examples of the metal may be Ti, Hf, Zr, and Al.

Figure 7B:
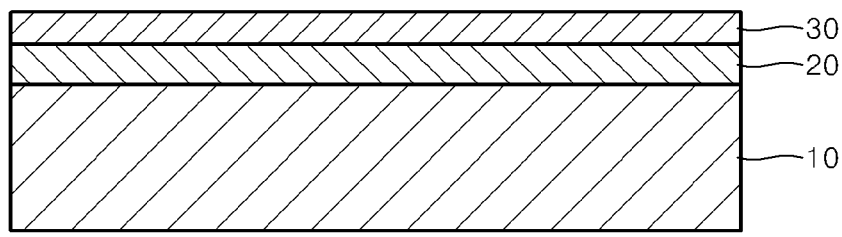

Referring to FIG. 7B, the nitride-based metal layer 30 may be selectively further formed on the metal layer 20. The nitride-based metal layer 30 may be formed by thermally treating the metal layer 20 at a temperature between about 100° C. and about 1500° C. in a gas atmosphere including nitrogen such as $NH_3$. Similar to the metal layer 20, the nitride-based metal layer 30 may also satisfy the aforementioned two conditions.

Figure 7C:
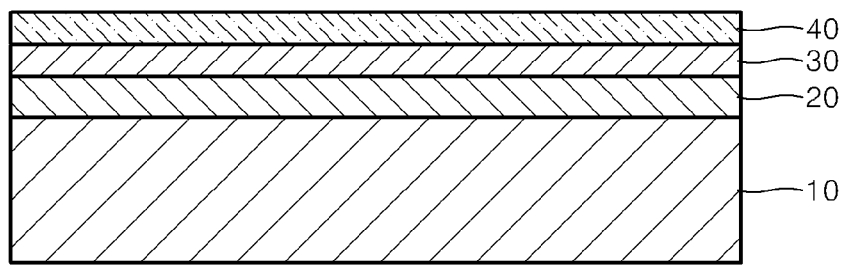

Referring to FIG. 7C, the buffer layer 40 is formed on the metal layer 20 or the nitride-based metal layer 30. The buffer layer 40 may be formed of a III-V group-based compound semiconductor, TiN, or the like. The buffer layer 40 may be formed by stacking at least one layer selected from among the group consisting of a layer formed of the III-V group-based compound semiconductor and a layer formed of TiN. That is, the buffer layer 40 may be a single layer formed by using one of the aforementioned materials or may be a plurality of layers such as two layers, three layers, or the like. Here, the III-V group-based compound semiconductor may include at least one selected from the group consisting of GaN, AN, AlGaN, InGaN, and InAlGaN. Also, the buffer layer 40 may have a preferred orientation in the vertical direction (the C-axis direction) with respect to its surface, due to the preferred orientation of the metal layer 20 or the nitride-based metal layer 30 below the buffer layer 40, and due to thermal treatment at a high temperature of about 1050° C.

Figure 7D:
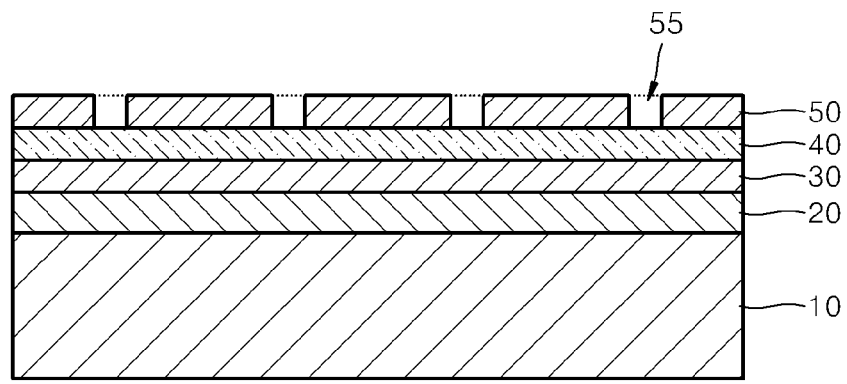

Referring to FIG. 7D, the mask layer 50 is formed on the buffer layer 40, and the holes 55 are formed by patterning the mask layer 50. The mask layer 50 may be formed of oxide or nitride, e.g., the mask layer 50 may be formed of $SiO_2$, $Si_3N_4$, or the like. The holes 55 may penetrate through the mask layer 50 so as to expose the buffer layer 40 formed below the mask layer 50. Since the grown plurality of semiconductor elements 60 may be grown from the buffer layer 40 via each of the holes 55, it is possible to control a position for a growth of the plurality of semiconductor elements 60, a size, and the like of the plurality of semiconductor elements 60 by selecting the number of holes 55, positions, a size, and the like of the holes 55. A diameter of each hole 55 may be between about 10 nm and about 5 μm, and its cross-section may have a circular shape or a polygonal shape. The thermal treatment performed on the buffer layer 40 may be performed after patterning the mask layer 50 to have holes 55.

Figure 7E:
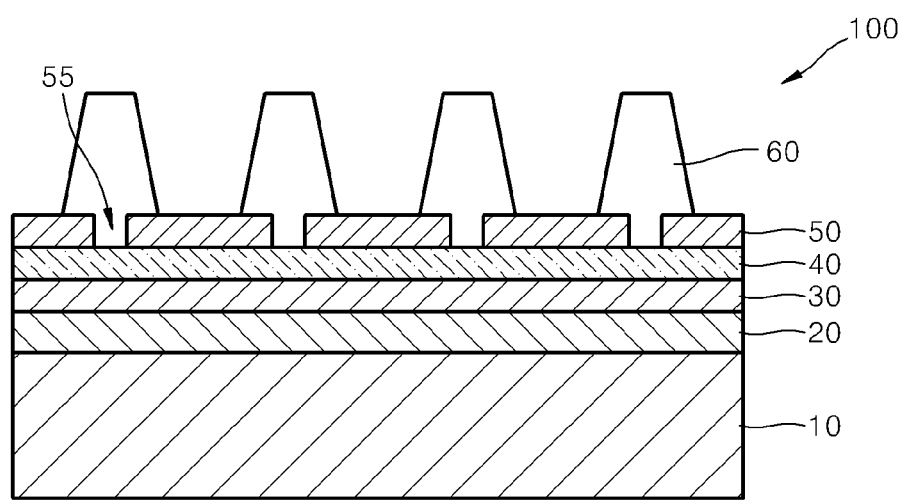

Referring to FIG. 7E, via each of the holes 55 formed in the mask layer 50, the grown plurality of semiconductor elements 60 may be vertically grown from the buffer layer 40 at a high temperature between about 1030° C. and about 1080° C. The grown plurality of semiconductor elements 60 may have a rod shape or a pyramid shape, and due to the preferred orientation of the buffer layer 40, the grown plurality of semiconductor elements 60 may have preferred orientation in the vertical direction (the C-axis direction) with respect to a surface of the buffer layer 40. The grown plurality of semiconductor elements 60 may be formed of a III-V group-based compound semiconductor, and may be formed of at least one selected from the group consisting of GaN, GaInN, AlGaN, and AlGaInN.

For example, the buffer layer 40 may be formed with LT-GaN by growing GaN on the metal layer 20 or the nitride-based metal layer 30 at a low temperature between about 450° C. and about 800° C., and then the grown plurality of semiconductor elements 60 may be formed with HT-GaN by growing GaN from the buffer layer 40 at a high temperature between about 980° C. and about 1100° C. Also, the LT-GaN may have a preferred orientation in the C-axis direction by being thermally treated at a temperature between about 100° C. and about 1500° C. in a gas atmosphere including nitrogen such as $NH_3$. The HT-GaN may have a preferred orientation in the C-axis direction due to the preferred orientation of the LT-GaN formed therebelow.

The method of manufacturing the stacked structures 100 and 100' may be used to manufacture the grown plurality of semiconductor elements 60 that is grown on the amorphous substrate 10 while controlling its direction and position. That is, the method may be used to manufacture the grown plurality of semiconductor elements 60 that is preferably oriented in the C-axis direction on the amorphous substrate 10 that is inexpensive and may be enlarged, and to apply the grown plurality of semiconductor elements 60 so as to manufacture various semiconductor devices. Here, FIGS. 7A through 7E stepwise illustrate the method of manufacturing the stacked structures 100 and 100', and in order to manufacture the p-n junction devices such as the light-emitting devices 200 and 200' or the solar cells 300 and 300' which include the stacked structures 100 and 100', the operations illustrated in FIGS. 7F through 7I may be additionally performed.

Figure 7F:
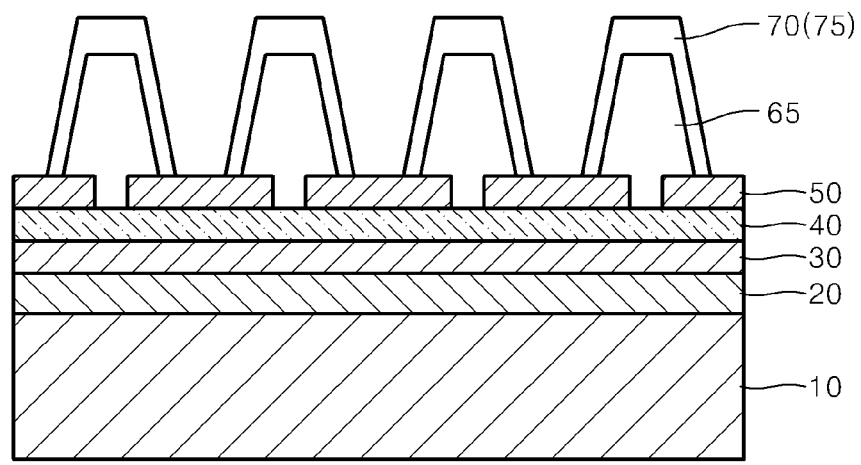

Referring to FIG. 7F, in order to manufacture the light-emitting device 200 or 200', the active layer 70 is formed on the grown plurality of semiconductor elements 60 of FIG. 7E, that is, the first conductive type semiconductor elements 65. The first conductive type semiconductor elements 65 may be formed by doping a III-V group-based compound semiconductor with a first conductive type dopant. The III-V group-based compound semiconductor may include at least one selected from the group consisting of GaN, GaInN, AlGaN, and AlGaInN. For example, the first conductive type semiconductor elements 65 may be formed by doping a semiconductor material having a composition formula of $Al_xIn_yGa_{(1-x-y)}N$ (where, $0 \leq x \leq 1$, $0 \leq y \leq 1$, $0 \leq x+y \leq 1$) with a first conductive type dopant. The first conductive type dopant may be an n-type dopant, and the n-type dopant may include P, As, Sb, Sn, Si, Ge, Se, Te, and the like. The first conductive type semiconductor elements 65 may be grown by using an MOCVD method, a HVPE method, or an MBE method.

The active layer 70 may emit light having a predetermined energy due to the recombination of electrons and holes, and may be formed of a semiconductor material including $In_xGa_{1-x}N_{(0 \leq x \leq 1)}$ so that a bandgap energy may be adjusted according to an Indium content. Also, the active layer 70 may include an MQW layer formed by alternately stacking a quantum barrier layer and a quantum well layer.

Figure 7G:
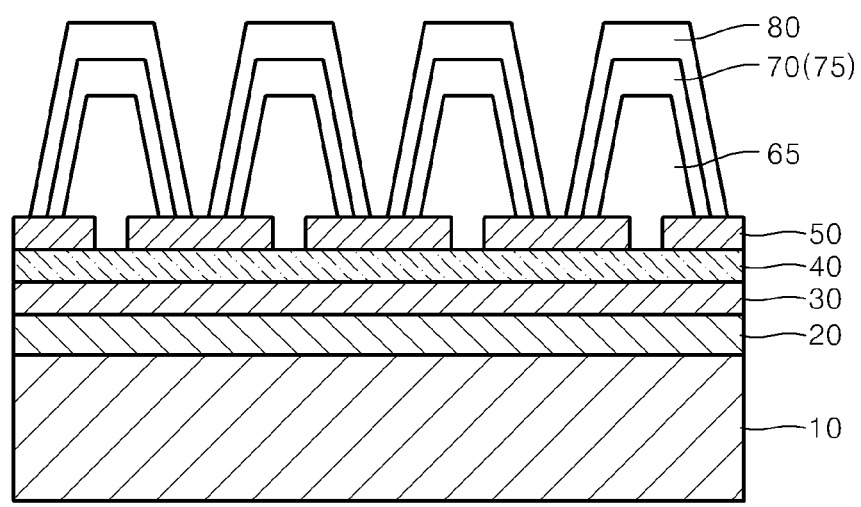

Referring to FIG. 7G, the second conductive type semiconductor layer 80 may be formed on the active layer 70. The second conductive type semiconductor layer 80 may be formed by doping a III-V group-based compound semiconductor with a second conductive type dopant, and the III-V group-based compound semiconductor may include at least one selected from the group consisting of GaN, GaInN, AlGaN, and AlGaInN. For example, the second conductive type semiconductor layer 80 may be formed by doping a semiconductor material having a composition formula of $Al_xIn_yGa_{(1-x-y)}N$ (where, $0 \leq x \leq 1$, $0 \leq y \leq 1$, $0 \leq x+y \leq 1$) with a second conductive type dopant. The second conductive type dopant may be a p-type dopant, and the p-type dopant may include B, Al, C, Mg, Zn, Be, or the like. The second conductive type semiconductor layer 80 may be grown by using an MOCVD method, a HVPE method, or an MBE method. In the light-emitting device 200, the first conductive type semiconductor elements 65 may be an n-type semiconductor and the second conductive type semiconductor layer 80 may be a p-type semiconductor, or vice versa.

Figure 7H:
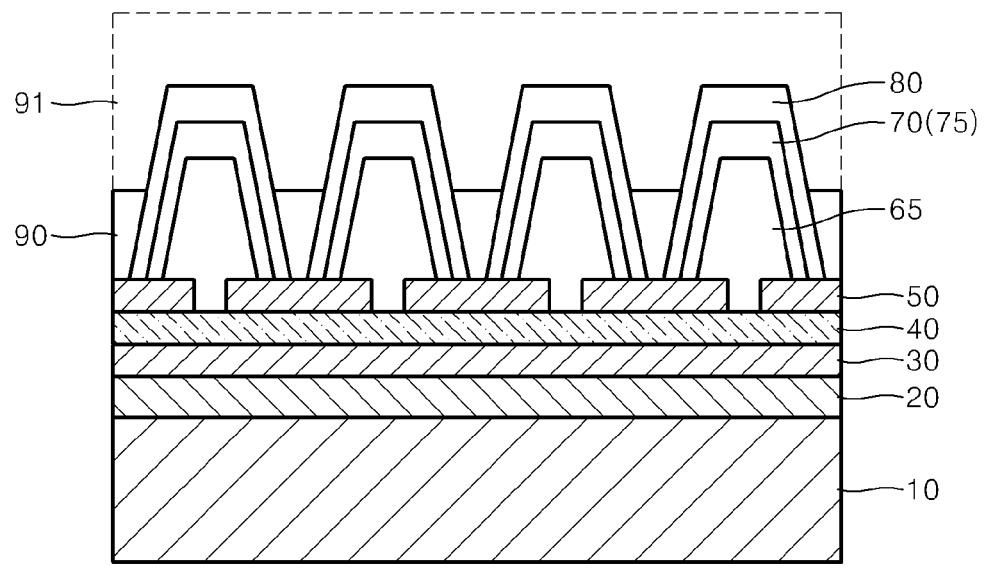
Figure 7I:
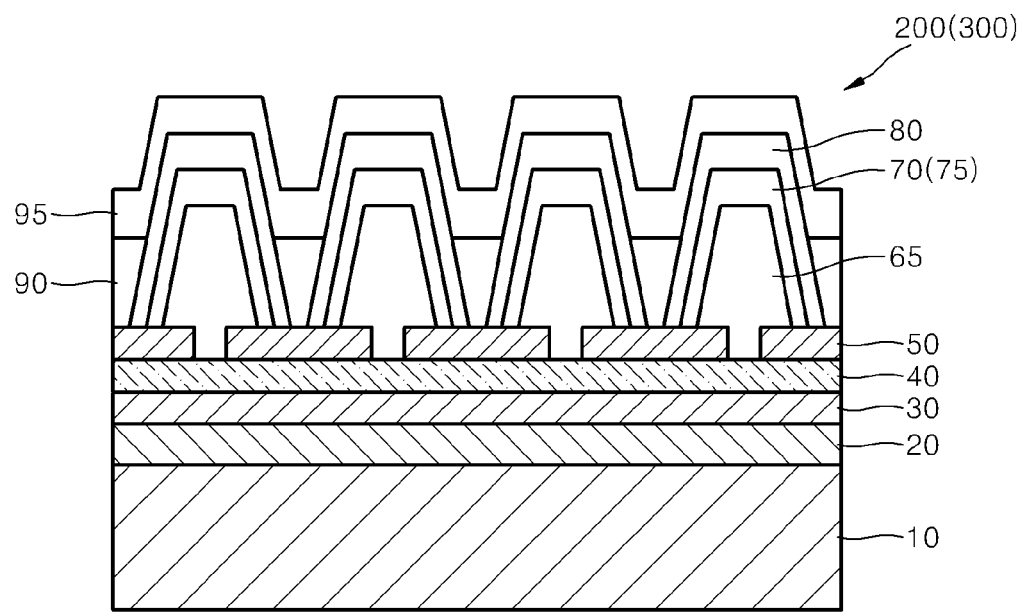

Referring to FIG. 7H, an insulating layer is formed on the mask layer 50 and the second conductive type semiconductor layer 80 by coating one of insulating materials including silicon oxide ($SiO_2$), silicon nitride, polymer, and the like. Afterward, by performing selective etching, e.g., by performing a photoresist (PR) descum process, a portion 91 of the insulating layer is removed to expose a portion of the second conductive type semiconductor layer 80. By doing so, the insulating layer 90 may be formed covering portions of the mask layer 50 and the second conductive type semiconductor layer 80.

Referring to FIG. 7I, a transparent conductive material including ITO, ZnO, $SnO_2$, or the like is coated on the exposed second conductive type semiconductor layer 80 and the exposed insulating layer 90 so that the transparent electrode layer 95 is formed.

In order to manufacture the solar cells 300 and 300', while manufacturing operations of FIG. 7F are performed, not the active layer 70 but the second conductive type semiconductor layer 80 is formed on the first conductive type semiconductor elements 65. Also, the I-type semiconductor layer 75 may be further formed between the first conductive type semiconductor elements 65 and the second conductive type semiconductor layer 80. Afterward, by performing operations of FIGS. 7G through 7I, the solar cells 300 and 300' may be manufactured.

It should be understood that the exemplary embodiments of the stacked structure including the vertically grown semiconductor, the p-n junction device including the stacked structure, and the method of manufacturing them that are described therein should be considered in a descriptive sense only and not for purposes of limitation. Descriptions of features or aspects within each embodiment should typically be considered as available for other similar features or aspects in other embodiments.

What is claimed is:
1. A stacked structure comprising:
an amorphous substrate;
a metal layer disposed on the amorphous substrate and having a crystal orientation in a vertical direction with respect to a surface of the metal layer;
a buffer layer disposed on the metal layer and having a crystal orientation in a vertical direction with respect to a surface of the buffer layer due to the crystal orientation of the metal layer;
a mask layer disposed on the buffer layer and having a plurality of holes exposing areas of the buffer layer; and
a plurality of semiconductor elements grown from the areas of the buffer layer exposed by the plurality of holes of the mask layer so as to extend through the plurality of holes of the mask layer and having a crystal orientation in a vertical direction with respect to a surface of the semiconductor elements due to the crystal orientation of the buffer layer,
wherein a lattice mismatch of the metal layer with respect to each of the plurality of semiconductor elements is equal to or less than about 20%.

2. The stacked structure of claim 1, wherein each of the plurality of semiconductor elements has a rod shape or a pyramid shape.

3. The stacked structure of claim 1, wherein each of the plurality of semiconductor elements comprises a III-V group-based compound semiconductor.

4. The stacked structure of claim 1, wherein each of the plurality of semiconductor elements comprises at least one selected from the group consisting of GaN, GaInN, AlGaN, and AlGaInN.

5. The stacked structure of claim 1, wherein a crystalline structure of the metal layer is a hexagonal close-packed structure or a face-centered cubic structure.

6. The stacked structure of claim 1, wherein the metal layer is formed of at least one metal selected from the group consisting of Ti, Hf, Zr, and Al.

7. The stacked structure of claim 1, wherein the metal layer comprises a nitride-based metal layer.

8. The stacked structure of claim 1, wherein the amorphous substrate is formed of glass or plastic.

9. A light-emitting device comprising:
an amorphous substrate;
a metal layer disposed on the amorphous substrate and having a crystal orientation in a vertical direction with respect to a surface of the metal layer;
a buffer layer disposed on the metal layer and having a crystal orientation in a vertical direction with respect to a surface of the buffer layer due to the crystal orientation of the metal layer;
a mask layer disposed on the buffer layer and having a plurality of holes exposing areas of the buffer layer;
a plurality of first conductive type semiconductor elements grown from the areas of the buffer layer exposed by the plurality of holes of the mask layer so as to extend through the plurality of holes of the mask layer and having a crystal orientation in a vertical direction with respect to a surface of the semiconductor elements due to the crystal orientation of the buffer layer;
an active layer disposed on the plurality of first conductive type semiconductor elements;
a second conductive type semiconductor layer disposed on the active layer; and
a transparent electrode layer formed on the second conductive type semiconductor layer,
wherein a lattice mismatch of the metal layer with respect to each of the plurality of semiconductor elements is equal to or less than about 20%.

10. The light-emitting device of claim 9, wherein each of the plurality of first conductive type semiconductor elements has a rod shape or a pyramid shape.

11. The light-emitting device of claim 9, wherein a crystalline structure of the metal layer is a hexagonal close-packed structure or a face-centered cubic structure.

12. The stacked structure of claim 1, wherein the buffer layer comprises at least one layer selected from among the group consisting of a layer formed of a III-V group-based compound semiconductor and a layer formed of TiN.

13. The stacked structure of claim 12, wherein the III-V group-based compound semiconductor comprises at least one selected from the group consisting of GaN, AlN, AlGaN, InGaN, and InAlGaN.

* * * * *